United States Patent [19]

Cota et al.

[11] 3,886,005

[45] May 27, 1975

[54] METHOD OF MANUFACTURING SEMICONDUCTOR DEVICES

[75] Inventors: Marlo E. Cota, Scottsdale; John F. Osborne, Tempe, both of Ariz.

[73] Assignee: Motorola, Inc., Chicago, Ill.

[22] Filed: July 13, 1973

[21] Appl. No.: 379,046

[52] U.S. Cl. ............... 148/188; 148/187; 148/175; 357/56; 156/17

[51] Int. Cl. ............................................ H01l 7/34

[58] Field of Search ........... 148/187, 188, 1.5, 175; 156/17; 357/56

[56] References Cited

UNITED STATES PATENTS

| | | | |
|---|---|---|---|
| 3,532,564 | 10/1970 | Gittler | 148/188 |
| 3,615,956 | 10/1971 | Irving et al. | 148/1.5 X |
| 3,783,046 | 1/1974 | Myers | 148/187 |
| 3,795,557 | 3/1974 | Jacob | 156/17 X |

*Primary Examiner*—G. Ozaki
*Attorney, Agent, or Firm*—Vincent J. Rauner; Ellen P. Trevors; Charles R. Hoffman

[57] ABSTRACT

A method of making semiconductor devices using selective impurity diffusion techniques. A dopant layer of a first conductivity type is formed on a semiconductor body of a second conductivity type. A patterned photoresist layer is formed on the dopant layer to mask portions thereof, and an etchant is used to remove the exposed area of the dopant layer in the unmasked areas, exposing the semiconductor body thereat. A thin layer of the semiconductor body is removed at the exposed areas by being subjected to a plasma etchant in a plasma reactor. The photoresist is removed by substituting oxygen for the plasma etchant in the plasma reactor. The semiconductor is then heated to diffuse a region of said second conductivity type into the semiconductor. A protective oxide coating may be provided on the exposed silicon prior to the diffusion step to prevent autodoping. The protective oxide coating and the dopant layer are removed. The delineation provided by the plasma etching step may be used as an aid in subsequent mask alignment steps.

5 Claims, 16 Drawing Figures

METHOD OF MANUFACTURING SEMICONDUCTOR DEVICES

RELATED APPLICATIONS

The invention described herein is related to the invention described in the U.S. patent application entitled "Integrated Circuit Devices and Method of Manufacture," inventors Marlo E. Cota and Lamonte H. Lawrence, Ser. No. 379,047, filed on even date herewith and assigned to the assignee of the present invention.

BACKGROUND OF THE INVENTION

1. Field of the Invention

The invention relates to improved methods of manufacturing integrated semiconductor devices utilizing selective diffusion from patterned dopant oxide layers, wherein diffusion masking oxide layers are not required, and wherein plasma etching is used to provide delineation to aid in successive mask alignment steps and to clean the semiconductor surface.

2. Description of the Prior Art

It is known in the art to fabricate integrated circuits by diffusing impurities from a gaseous ambient or from a doped oxide through a patterned masking oxide, stripping the masking oxide, growing an epitaxial layer on the substrate, oxidizing the substrate, etching openings in the oxide and diffusing isolation regions through the epitaxial layer. Subsequent oxidation and diffusion steps have been utilized to produce the base regions and the emitter regions. However, formation of the masking oxide for each diffusion step has resulted in a large number of high temperature thermal cycling steps, which propagate crystal damage in the device, which in turn reduces yield by causing device failures. Further, the high temperature oxidation steps and diffusion from gaseous dopant sources necessitate closed-tube reactor systems, which are expensive and have low through-put rates. The thickness of the masking oxide layer has been typically in the range of 5,000 – 11,000 A for integrated circuit devices; this thickness has limited the resolution of the etched openings, and hence the component density on the chip. It has been found that for diffusion from a pyrolytically deposited doped oxide source, junction depth depends strongly on mask opening width in the masking oxide. Junction depth increases with decreasing mask opening size, passes through a maximum value as large as three times the unmasked value, and then decreases slightly at the smallest opening widths.

These results are shown to be consistent with the presence of an accelerated diffusion at the mask edge, and may cause reduced breakdown voltage or emitter-base punchthrough. This enhanced penetration of dopant impurities in the case of masked diffusion is thought to be due to one or more of three different effects: strain effects, source film edge effects, and indiffusion from impurities in the mask. The strain effects are thought to be caused by a significantly different coefficient of expansion between the diffusion mask and a substrate. When a portion of the mask is removed for diffusion therethrough, it is thought that the elastic strain at the vicinity of the edge of the mask opening could be relieved by generation of a dislocation network along the edged mask, which might occur during thermal cycling. Further, difficulties have been encountered in achieving required tolerances in successive photomask alignment operations, especially for those photomasks which must be aligned to the buried layer regions, since the buried layer masking oxide must be removed before the epitaxial layer is grown, thereby eliminating the oxide edge which would otherwise serve as an alignment cue.

The present invention solves the major shortcomings of the previous methods by providing a method of fabricating integrated circuits having a reduced number of high temperature cycles, which utilizes low cost open-tube diffusion systems, and provides on the semiconductor surface well defined alignment aids which facilitate subsequent photomask alignment operations.

SUMMARY OF THE INVENTION

In view of the foregoing considerations, it is an object of this invention to provide an elevated mesa region of a first conductivity type in a second region of a second conductivity type.

It is an object of this invention to provide a semiconductor device having in a collector region a mesa region subtending the buried layer region.

It is another object of the invention to provide a semiconductor device having a portion of its base region forming a mesa elevated above the collector region.

It is yet another object of this invention to provide a semiconductor device having an elevated emitter region.

It is another object of this invention to provide a method of manufacturing an integrated circuit of the type described.

It is another object of this invention to provide a method of manufacturing a semiconductor device wherein the number of high temperature thermal cycling steps is minimized.

It is another object of this invention to provide a method of manufacturing a semiconductor device wherein build-up of dopant at the edge of diffused regions is eliminated.

It is another object of this invention to provide a method of manufacturing a semiconductor device wherein improved alignment aids are provided to facilitate subsequent alignment operations.

It is another object of this invention to provide a method for making a semiconductor device including the step of depositing a thin dopant layer at low temperatures on a semiconductor body, patterning the dopant layer, removing exposed semiconductor material with a plasma etchant to delineate the subsequently formed diffused region, and diffusing impurities from said patterned dopant layer into the semiconductor body.

It is a further object of this invention to provide a method of manufacturing a semiconductor device including removing photoresist from the semiconductor body by substituting oxygen for a plasma etchant in the plasma reactor.

Briefly described, the invention is a semiconductor device having an elevated region of semiconductor material subtending the buried layer region, and a method for making the semiconductor device. The exposed surface of the base region is elevated with respect to the collector region, and the exposed surface of the emitter region is elevated with respect to the base region. The invention further provides a method of manufacturing such an integrated circuit including the steps of providing a thin patterned dopant layer at low temperatures on the semiconductor substrate, plasma etching the exposed semiconductor to form an elevated mesa region beneath the patterned dopant layer, diffusing impurities from the dopant layer into the elevated region, removing the dopant layer from the substrate and growing an epitaxial layer thereon. Similar steps, after growing the epitaxial layers, are utilized to form the diffused isolation regions, the base regions, and the emitter regions.

DESCRIPTION OF THE INVENTION

Figure 1:
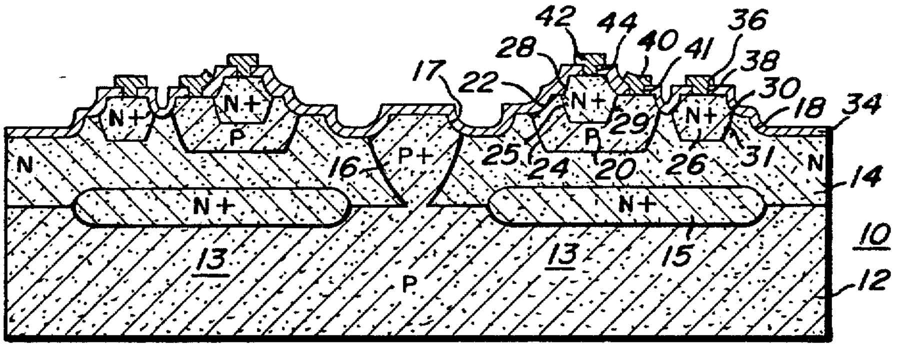
FIG. 1 is a cross-sectional diagram of a preferred embodiment of the invention.

FIG. 1 is a cross-sectional diagram of a preferred embodiment of the invention, wherein integrated circuit 10 having transistors 13 therein includes a P-type substrate 12 having an N-type layer thereon. The N-type layer includes a plurality of isolated N-type collector regions, the isolation being achieved by means of $P^+$ isolation region 16, which extends through the N-type layer to substrate 12, enclosing each of the collector regions individually. Isolation region 16 has an elevated portion forming a mesa region 17 which extends above the surface of the N-type regions isolated thereby. Such mesa regions described hereinafter are typically 50 – 300 angstrom units in height.

Isolated N-type region 14 is the collector of transistor 13, which also has an $N^+$ buried layer region 15 situated between and extending into N-type region 14 and into substrate 12, but not touching isolation region 16. N-type collector region 14 has, on its upper surface, an elevated mesa region 18. The side boundaries of mesa region 18 subtend the side boundaries of buried layer 15 for each transistor in integrated circuit 10. A P-type base region 20 is formed partially within N-type mesa region 18, forming PN junction 24 with collector region 14. P-type base region 20 has an elevated portion thereof, forming a mesa region 22 which extends above the level of N-type mesa region 18. An $N^+$ emitter region 25 is formed in base region 20, forming PN junction 29 therewith, and has an elevated portion forming mesa region 28, which extends above the elevated surface of mesa region 22. $N^+$ collector contact region 26 is formed within mesa region 18, forming an $N^+N$ junction 31 therewith. Collector contact region 26 has an elevated portion forming mesa region 30, which extends above the surface of mesa region 18. Passivation layer 34, which may be silicon dioxide, covers the upper surface of integrated circuit 10, and has openings 38, 41, and 44 exposing, respectively, collector contact region 26, base region 20, and emitter region 25. Metal connections 36, 40, and 42 provide ohmic contact, respectively, to collector region 26, base region 20, and emitter region 25.

The features of integrated circuit 10 in FIG. 1 which distinguish it over the prior art are the elevated mesa regions 18, 22, 28, and 30, all of which are approximately 100 angstroms or more in height, an amount sufficient to aid precise alignment for the photomasking steps required in the fabrication of the device 10. In conventional integrated circuits, such mesa type regions are not normally present. Instead, the inverse type of structure is normally present, that is, the region of the surface of the isolated collector region subtending the buried layer is somewhat depressed, and the surface of the base region is slightly further depressed, and the surface of the emitter region is also further depressed with respect to the surface of the base region. Further, in conventional integrated circuits, masking oxide thicknesses are of such magnitudes as to limit pattern resolution (size) and definition (quality). However, the dopant films are generally 2000 angstroms or less in thickness, thus improving resolution, pattern size control, and pattern definition or line resolution.

Figure 2:
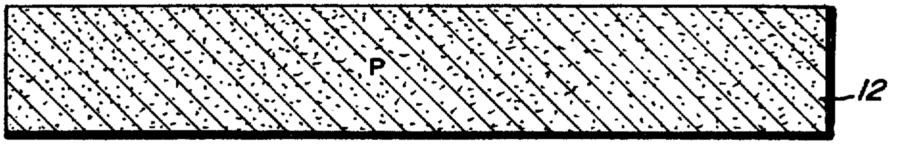
FIGS. 2 — 14 are cross-sectional diagrams illustrating a preferred method for obtaining the device of FIG. 1.
Figure 3:
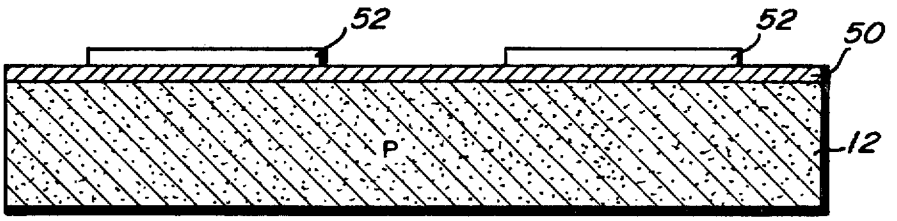

FIGS. 2–14 illustrate a preferred method of obtaining the integrated circuit device 10 illustrated in FIG. 1. FIG. 2 depicts the starting material, a polished P-type silicon substrate 12, which is typically 10 ohm-centimeters. Referring to FIG. 3, a thin N-type doped oxide layer 50 is deposited on the polished surface of wafer 12. Doped oxide layer 50 may be approximately 1500 angstrom units thick.

A patterned photoresist layer 52 is provided on doped oxide layer 50 to act as a mask against the etchant used to pattern doped oxide layer 50. Doped oxide layer 50 may be provided by various techniques at relatively low temperatures (to prevent generation of defects in the semiconductor material, as previously explained), including pyrolytic deposition, painting, spraying, or spinning the dopant material on substrate 12. As previously mentioned, it is essential that the silicon surface be very clean prior to formation of the doped oxide layer. According to the invention, the wafer is subjected to an ultrasonic bath in an abrasive detergent, which may be a solution of Alconox and water. Abrasive detergents contain a salt of a long-chain acid such as sodium stearate. Abrasion can be introduced by the addition of fine particulate aluminum oxide. Alconox is a commercial trade name for such a detergent. In deriving the method of the invention, a large number of acid and solvent detergent cleaning agents were tested. The ultrasonic abrasive detergent bath worked well, and has the advantages of low cost, safety, ease of handling and ease of disposal of waste material. The patterned photoresist layer 52 is provided using conventional photolithographic techniques, which may include coating the surface of doped oxide layer 50 with photoresist solution, exposing it selectively to ultraviolet radiation through a photomask, and developing the unexposed areas without using a suitable solvent, and baking to dry and harden the remaining layer 52.

Figure 4:
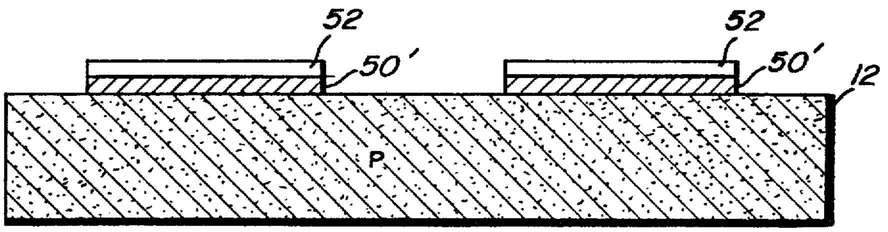

The next step in the process, depicted in FIG. 4, is the removal of the exposed portions of doped oxide layer 50 by an etchant, leaving dopant layers 50' coextensive with patterned photoresist layer 52. The etching process may be achieved by immersing substrate 12 in, for example, a buffered HF solution, or a suitable gas or plasma etchant may be utilized to provide a dry etching manufacturing process step.

Figure 5:
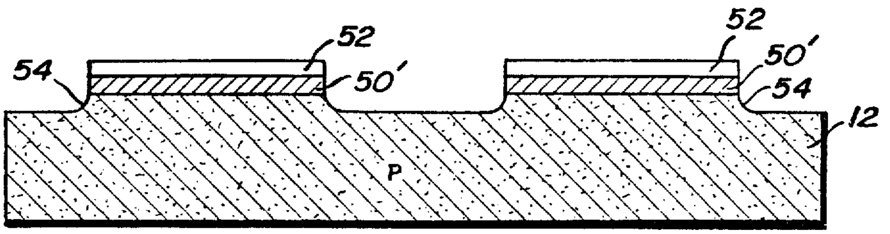
Figure 6:
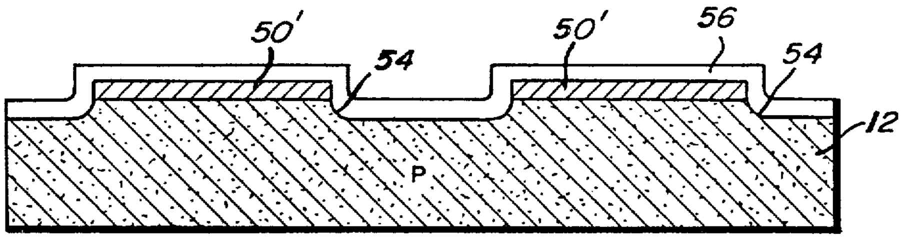

FIG. 5 illustrates the structure after the substrate 12 has been subjected to a carbon tetrafluoride plasma etching process in a plasma reactor, wherein a sufficient amount of exposed silicon is removed to form elevated mesa regions 54 beneath doped oxide layer 50' which may adequately facilitate subsequent photomask alignment operations. A suitable plasma reactor is a commercially available unit designed by LFE Corporation for the purposes of silicon etching or organic removal. It operates at a federally regulated 13.56 MHz frequency at 100 to 500 watts. Typical surface temperatures of 150°C and at a typical pressure of 1 mmHg. Typical etching rates are approximately 400 angstroms per minute. The plasma etching step further removes contaminants from the surface of the exposed silicon prior to diffusing impurities from doped oxide layer 50' into mesa regions 54. The photoresist is attacked by the plasma at a rate of 100 angstroms per minute while thermal oxide is attacked at a rate of 600 – 800 angstroms per minute. This process requires only a few seconds — less than one half minute — but the photoresist is the most effective mask. The height of mesa regions 54 may be approximately 50 – 300 angstroms.

Ideally, the removal of the exposed portion of doped oxide layer 50, and the carbon tetrafluoride plasma etching of exposed silicon may be performed in the same reactor with no handling operations between steps. The photoresist layer 52 is advantageously removed while the substrate 12 is in the plasma reactor by substituting an oxygen gas plasma for the carbon tetrafluoride plasma. When the $CF_4$ plasma etchant is replaced by oxygen to remove the photoresists, an oxygen plasma is formed, which burns off the photoresist at a low (150°C) temperature. Other chemical means may, however, be employed, or the photoresist may be removed by high temperature burning (600° – 900°C in oxygen). Then a protective oxide 56 is deposited on the surface of the wafer to produce the structure shown in FIG. 6. Protective oxide 56 is provided to prevent autodoping from the dopant oxide 50' during the drive-in diffusion. The autodoping could form a thin, deleterious N-type "skin" (not shown) on the otherwise exposed surface of wafer 12. The dopant species in layer 50' may be arsenic for example, or antimony. Depending on the dopant species and various other parameters, and also depending on the undesirability of the above-mentioned N-type skin caused by autodoping, the process step of depositing protective oxide layer 56 may be omitted in some cases. It should also be noted that in some cases it may not be necessary to remove the photoresist layer at all, the photoresist layer may in some cases be burned off by high temperature burning, as mentioned above. If there are no contaminants in the photoresist which will cause degradation of the device, the drive-in diffusion may be performed with photoresist layers 52 on the wafer; the high temperatures and oxygen will cause photoresist layers to decompose.

Figure 7:
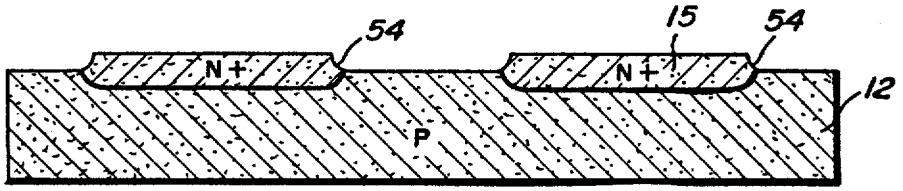

FIG. 7 is a cross-sectional diagram illustrating the structure after the drive-in diffusion is completed, forming buried layer regions 15 in mesa regions 54, after oxide layer 56 and dopant layer 50' have been stripped. The buried layer may be approximately 0.0075 ohm-centimeters in resistivity.

Figure 8:
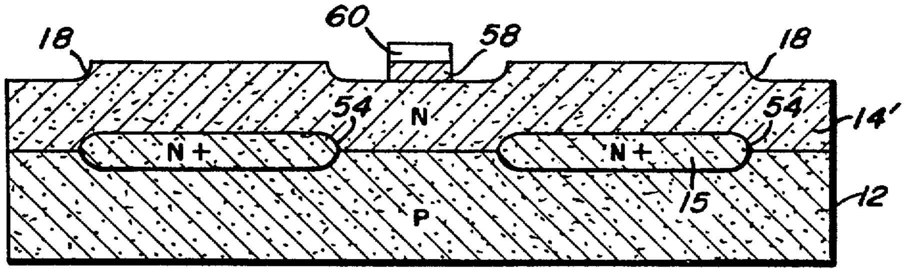

Next, N-type layer 14' is epitaxially grown on the surface of the device. Typical resistivities range from 0.1 – 10 ohm-centimeters. During epitaxial growth, the contour of the upper surface of the epitaxial layer 14 is maintained, so that epitaxial layer 14' has elevated mesa regions 18 which subtend the elevated mesa region 54, as shown in FIG. 8. N-type epitaxial layer 14' may be approximately 3 microns thick, and the height of mesa region 54 may be 100 angstroms. It should be noted that the drawings are not to scale, and the height of mesa region 54 is greatly exaggerated for clarity. using conventional techniques as described above, a P-type doped oxide is deposited, as previously described, on the surface of the wafer, and a photoresist layer is patterned thereon, and the exposed doped oxide is removed by etching to produce the patterned doped oxide layer 58 coextensive with overlying patterned photoresist layer 60, as shown in FIG. 8.

Figure 9:
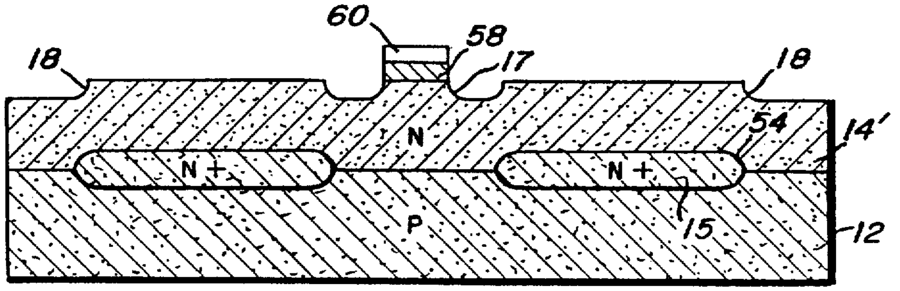
Figure 10:
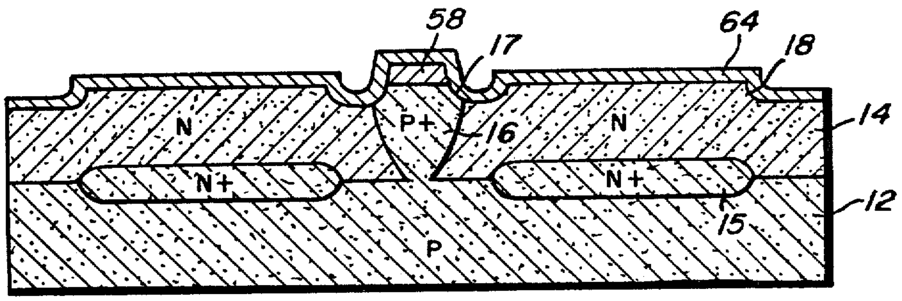
Figure 11:
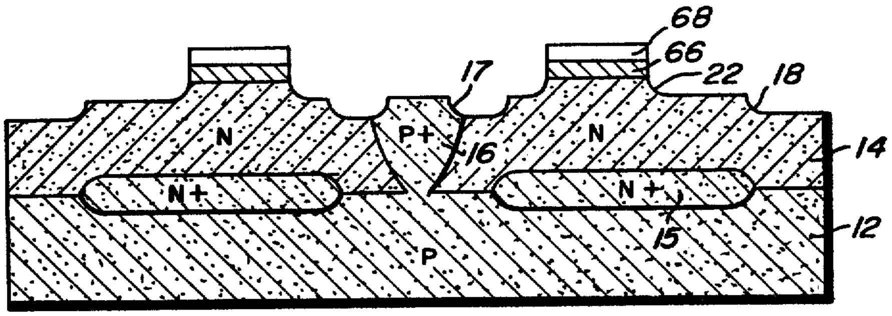

Next, the wafer is subjected to carbon tetrafluoride plasma etching, as described previously, with photoresist layer 60 and doped oxide layer 58 acting as a mask against the plasma etchant, the exposed silicon being removed to leave a mesa region 17 beneath doped oxide 58, as depicted in FIG. 9. After photoresist removal, preferably by substitution of oxygen for the carbon tetrafluoride plasma etchant in the plasma reactor, a protective oxide layer 64 is provided on the surface of the wafer in one embodiment of the invention. In one embodiment of the invention, the oxide layer 64 is omitted as previously explained. In another embodiment, the photoresist layer 60 is not removed, as previously explained. The wafer is then heated to diffuse P-type impurities into N-type region 14' to provide a deep isolation channel 16 extending through region 14' to substrate 12, surrounding collector region 14 and electrically isolating it, as shown in FIG. 10.

Figure 12:
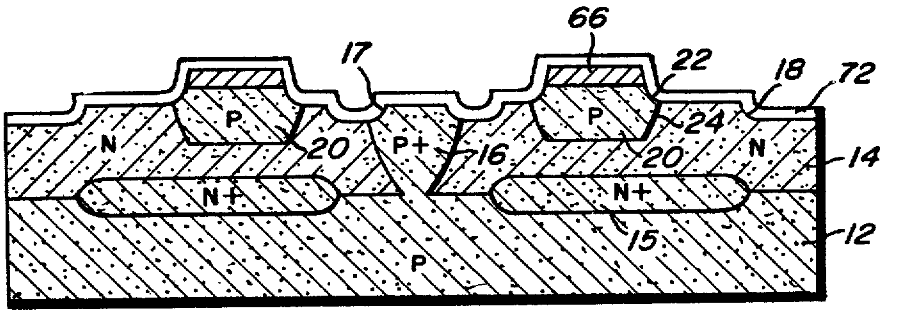

Next, oxide layer 64 is removed, and the silicon surface is cleaned by immersing it in an ultrasonic Alconox detergent bath. A P-type doped oxide layer is then deposited on the surface of the wafer. Using conventional techniques, a layer of photoresist is applied and patterned to define the base regions to be formed in mesa region 18. The exposed portion of P-type doped oxide layer is removed by a suitable etchant, and the wafer is then subjected to the carbon tetrafluoride plasma etchant in the plasma reactor, producing the structure illustrated in FIG. 11, wherein elevated mesa region 22 is shown underlying patterned doped oxide layer 66, which underlies patterned photoresist layer 68. The photoresist layer 68 is then removed as shown with reference to FIGS. 11 and 12. Protective oxide layer 72 is then applied to the wafer (to prevent autodoping), which is then heated to diffuse base region 20 into collector region 14, said base region forming a junction 24 with collector region 14, as shown in FIG. 12.

Figure 13:
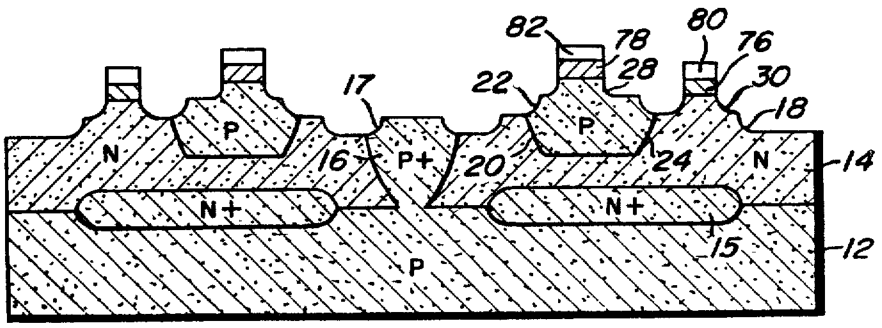

Next, protective oxide layer 72 is removed, and the surface of the wafer is cleaned in an ultrasonic Alconox detergent bath, and an N-type doped oxide layer and a photoresist layer are applied to the surface of the wafer, which N-type doped oxide layer and photoresist layers are patterned as shown in FIG. 13, wherein doped oxide layer 78 and photoresist layer 82 define the subsequently formed emitter region and doped oxide layer 76 and photoresist layer 80 define the subsequently formed collector contact regions. The wafer is then subjected to a carbon tetrafluoride plasma to remove exposed silicon, thereby forming mesa regions 28 and 30, as shown in FIG. 13, photoresist layers 80 and 82 acting, respectively, to mask against the plasma. The photoresist layers 80 and 82 are then removed as shown with reference to FIGS. 13 and 14.

Figure 14:
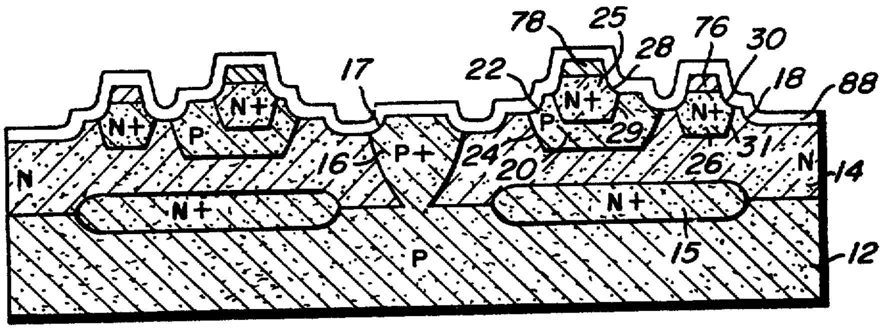

Protective oxide layer 88 is then formed on the wafer surface, to prevent autodoping. The wafer is then subjected to heat to diffuse impurities from the doped oxide layers 76 and 78, and collector contact region 26 is thereby formed, forming $N^+N$ junction 31 with collector region 14, and emitter region 25 is formed in base region 20, forming junction 29 therewith, as shown in FIG. 14. After removal of protective oxide layer 88, passivation layer 34, which may be silicon dioxide, is formed on the surface of the wafer, as shown in FIG. 1. Apertures 38, 41, and 44 are then etched in passivation layer 34 using conventional photolithographic and etching techniques. Metal electrodes 36, 40, and 42 are provided to provide ohmic contact, respectively, to collector 14, base 20, and emitter 25, thereby producing the completed integrated circuit transistor 13.

Figure 15:
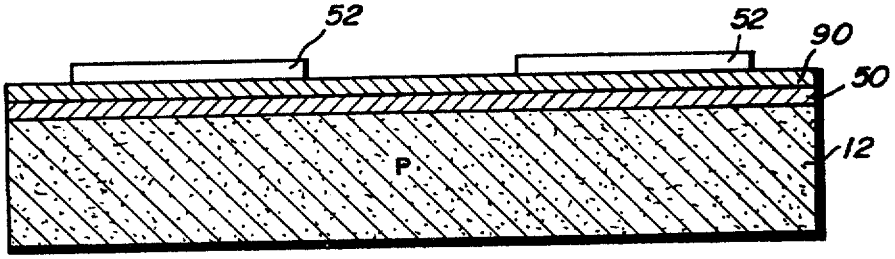
FIGS. 15 and 16 are cross-sectional diagrams illustrating alternative manufacturing steps in the method for obtaining the device of FIG. 1.
Figure 16:
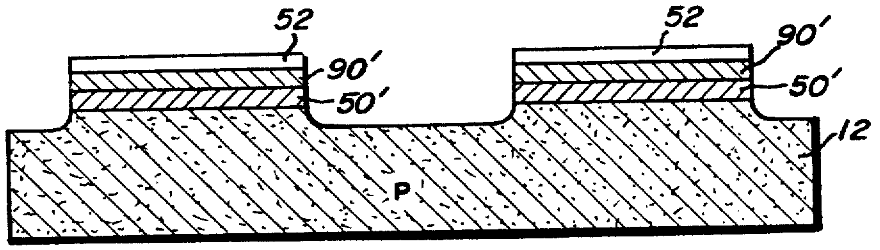

FIGS. 15 and 16 are cross-sectional diagrams illustrating alternative processing steps which may be repeated to form the various mesa regions and diffused regions in the integrated circuit structure of FIG. 1. For example, consider the previously described steps for obtaining the structure shown in FIG. 7, with FIGS. 2, 3, 4, 5, and 6 replaced by FIGS. 15 and 16. Referring to FIG. 15, after the ultrasonic abrasive detergent bath, doped oxide layer 50 is formed on substrate 12, as previously described. However, the protective oxide layer 90 is then formed by deposition on doped oxide layer 50, to prevent autodoping during the subsequent drive-in diffusion. Patterned photoresist layer 52 is then provided on oxide layer 90 to complete the structure shown in FIG. 15. The wafer is then subjected to a suitable etchant to pattern oxide layer 90 and doped oxide layer 50 and expose wafer 12. The wafer is then placed in a plasma reactor and subjected to a carbon tetrafluoride plasma etchant to remove a portion of the unmasked surface of silicon wafer 12, thereby producing the structure of FIG. 16. Removal of layers 50', 90' and 52 produces the structures of FIG. 7. This general procedure may be used to provide the base and emitter and collector contact regions, if desired.

In summary, the invention provides an economical method of manufacturing integrated circuits. Among the advantages of the method of the invention are the unique structure of the integrated circuit devices produced thereby, wherein the various diffused regions are delineated by the edges of elevated regions in the semiconductor material, which edges provide alignment aids which facilitate photomask alignment operations, thereby reducing cost and improving yield. Further, the number of high temperature cycles is reduced in the method of the invention as compared with a prior art. An important advantage of the invention is that dopant films are utilized in such a manner as to eliminate dopant build-up and defects associated therewith at the edge of openings in the masking oxide layers, further improving yield. Low cost, non-polluting cleaning materials are utilized in the abrasive detergent cleaning steps. Further, low cost, open tube diffusion apparatus are utilized to further reduce the cost associated with the method of the invention.

While the invention has been described in relation to several specific embodiments, those skilled in the art will recognize that variations in placement of parts and in order of manufacturing steps may be made within the scope of the invention.

What is claimed is:

1. A method for making a semiconductor device comprising the steps of:

depositing a first layer of a doped oxide of silicon of a second conductivity type on a surface of a body of silicon of a first conductivity type;

forming a first layer of photoresist on said first layer of doped oxide of silicon, said layer of photoresist being patterned to expose the surface of said first layer of doped oxide of silicon;

subjecting said exposed surface to a first etchant and removing said exposed surface of said first layer of doped oxide of silicon thereby exposing said surface of said body of silicon;

subjecting said exposed surface of said body of silicon and said first layer of photoresist to a plasma etchant in a reactor for selectively removing in sequence a predetermined thickness of material from said exposed silicon surface to delineate the region of said body of silicon beneath said first layer of doped oxide of silicon and said first layer of photoresist; and heating said body of silicon to diffuse doping impurities from said first layer of doped oxide of silicon into said body of silicon to form a region of said second conductivity type therein.

2. The method as recited in claim 1 wherein said first conductivity type is P-type and said second conductivity is N-type.

3. The method as recited in claim 2 wherein said plasma etchant is carbon tetrafluoride followed by oxygen.

4. The method as recited in claim 2 including the step of forming a first layer of undoped oxide of silicon to protect against autodoping on said body of silicon after exposing said body of silicon to said plasma etchant.

5. The method as recited in claim 2 wherein said predetermined thickness is between 50 and 300 angstrom units.

* * * * *